United States Patent
Kelly et al.

(10) Patent No.: US 7,685,554 B1
(45) Date of Patent: Mar. 23, 2010

(54) DETERMINATION OF DATA RATE AND DATA TYPE IN A HIGH-LEVEL ELECTRONIC DESIGN

(75) Inventors: Sean A. Kelly, Boulder, CO (US); Roger B. Milne, Boulder, CO (US); Jeffrey D. Stroomer, Lafayette, CO (US); Sreekanth Juttu, Longmont, CO (US)

(73) Assignee: Xilinx, Inc., San Jose, CA (US)

( * ) Notice: Subject to any disclaimer, the term of this patent is extended or adjusted under 35 U.S.C. 154(b) by 1280 days.

(21) Appl. No.: 11/185,125

(22) Filed: Jul. 20, 2005

(51) Int. Cl.
*G06F 17/50* (2006.01)

(52) U.S. Cl. .............. 716/17; 716/3; 716/4; 716/5; 716/16; 716/18; 703/13; 703/14; 703/22

(58) Field of Classification Search ........... 716/3, 716/4, 5, 16, 18; 703/13, 14, 22
See application file for complete search history.

(56) References Cited

U.S. PATENT DOCUMENTS

| | | | | |
|---|---|---|---|---|
| 5,870,588 | A * | 2/1999 | Rompaey et al. | 703/13 |
| 6,553,548 | B1 * | 4/2003 | Hekmatpour | 716/5 |
| 6,768,980 | B1 * | 7/2004 | Meyer et al. | 704/500 |
| 7,082,594 | B1 * | 7/2006 | Milne et al. | 716/18 |
| 7,110,935 | B1 * | 9/2006 | Hwang et al. | 703/20 |
| 7,203,632 | B2 * | 4/2007 | Milne et al. | 703/14 |
| 7,284,225 | B1 * | 10/2007 | Ballagh et al. | 716/16 |
| 7,343,572 | B1 * | 3/2008 | Stone et al. | 716/4 |
| 7,346,480 | B1 * | 3/2008 | Pekarek et al. | 703/14 |
| 7,424,410 | B2 * | 9/2008 | Orofino et al. | 703/2 |
| 7,433,813 | B1 * | 10/2008 | Ballagh et al. | 703/16 |
| 7,444,603 | B1 * | 10/2008 | Kelly et al. | 716/3 |
| 7,487,080 | B1 * | 2/2009 | Tocci et al. | 703/22 |
| 7,512,570 | B2 * | 3/2009 | Chang et al. | 706/11 |
| 7,519,524 | B2 * | 4/2009 | Nelson et al. | 703/13 |
| 7,533,008 | B2 * | 5/2009 | Mangino et al. | 703/6 |
| 2002/0010911 | A1 * | 1/2002 | Cheng et al. | 717/4 |
| 2006/0009959 | A1 * | 1/2006 | Fischer et al. | 703/18 |
| 2006/0164997 | A1 * | 7/2006 | Graepel et al. | 370/241 |

OTHER PUBLICATIONS

Clive Maxfield; "LPMs: High-Level Design Uses Low-Level Techniques"; EDN—Access; May 9, 1996; downloaded on Feb. 3, 2005 from http://www.edn.com/archives/1996/050996/10df3htm; pp. 1-7.
Craig Willert; "The Evolution of Programmable Logic Design Technology"; Xilinx 15th Anniversary; pp. 5-8, Jul. 20, 2005.

* cited by examiner

*Primary Examiner*—Helen Rossoshek
(74) *Attorney, Agent, or Firm*—LeRoy D. Maunu; Lois D. Cartier

(57) ABSTRACT

Determining data rates and data types in a an electronic design. In one embodiment, an electronic design is created in a memory arrangement in response to user input. The electronic design includes a plurality of functional blocks and a plurality of nets connecting the functional blocks. In response to user input, an output data rate and an output data type of data output from at least one of the functional blocks are determined. The input data rate and input data type to each functional block coupled via a net to the at least one functional block are equal to the output data rate and output data type, respectively, from the at least one functional block. For each functional block, an output data rate and output data type are determined as a function of the input data rate and the input data type of the functional block.

17 Claims, 5 Drawing Sheets

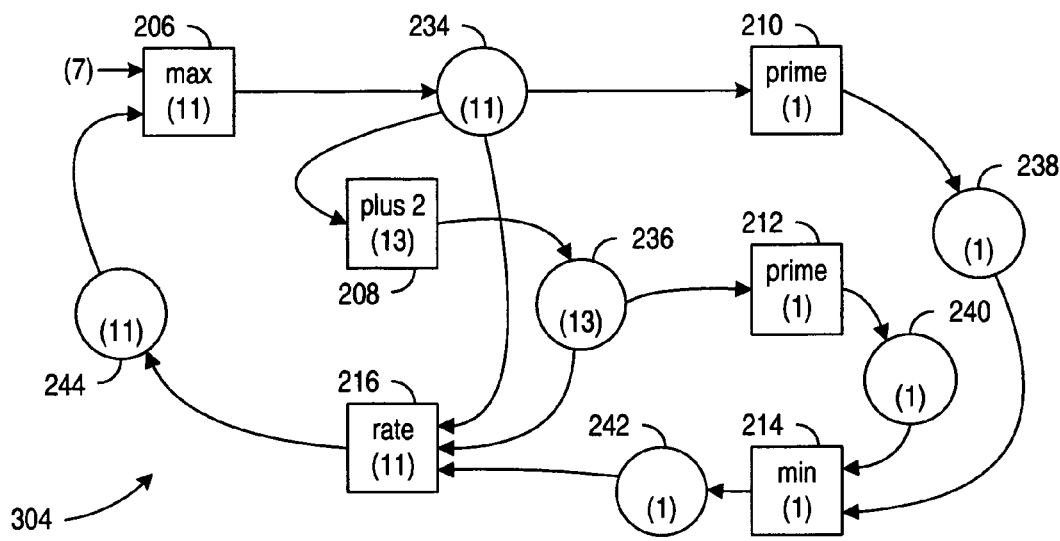
FIG. 3A
FIG. 3B
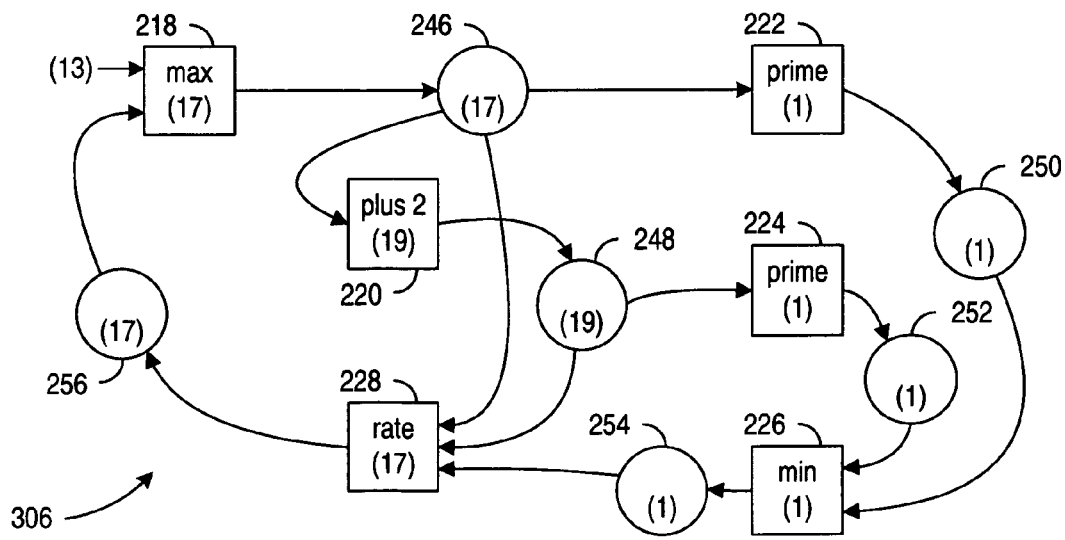
FIG. 3C

DETERMINATION OF DATA RATE AND DATA TYPE IN A HIGH-LEVEL ELECTRONIC DESIGN

FIELD OF THE INVENTION

The present invention generally relates to determining data rates and data types in a high-level electronic design.

BACKGROUND

A designer may use a high-level modeling system (HLMS), such as the System Generator HLMS available from Xilinx Inc., to design an electronic system at an abstract level using an intuitive user interface of the HLMS. In addition, the HLMS permits the designer to simulate the electronic system and translate the abstract representation of the electronic system into a hardware description language (HDL) for subsequent synthesis and production of a hardware implementation of the electronic system.

Various tools, including HLMS and synthesis tools, may increase the productivity of a designer of an electric system. The productivity of a designer may be increased by using previously designed blocks for frequently used functions that are provided in a library of an HLMS. Typically, such blocks in a library of an HLMS may be parameterized to allow the blocks to be adapted to a wide variety of system requirements. The productivity of a designer may also be increased by tools that automatically infer details of the electronic design from design information provided by the designer. For example, blocks in a library of an HLMS may have parameterized data processing rates. Selection by the designer of an actual data processing rate for a few blocks in the electronic design may permit a tool to infer compatible data processing rates for every block in the electronic design.

Parameters of a block may include the rate of data transfer and the type of data transfer, such as unsigned integers and fixed point numbers with various width representations, at the inputs and outputs of the block. A user-specified value for rate and/or type at one block may be propagated to other blocks by an HLMS, such as Simulink. However, existing methods may fail in processing electronic design having feedback loops or having interdependent rate and type parameters.

The present invention may address one or more of the above issues.

SUMMARY OF THE INVENTION

The various embodiments of the invention provide a processor-based method for determining data rates and data types in a an electronic design. In one embodiment, an electronic design is created in a memory arrangement in response to user input. The electronic design includes a plurality of functional blocks and a plurality of nets connecting the functional blocks. In response to user input, an output data rate and an output data type of data output from the functional block are determined for at least one of the functional blocks. The output data rate and output data type output from the functional block are equal to an input data rate and an input data type, respectively, of each functional block coupled via a net to the at least one functional block. An output data rate and an output data type are determined for each functional block as a function of the input data rate and the input data type of the functional block.

In another embodiment, the method includes generating in a memory arrangement a directed graph of nodes and edges from the electronic design. The directed graph is decomposed into an acyclic subgraph and at least one strongly connected subgraph. The acyclic subgraph includes a corresponding subgraph for each strongly connected subgraph, and each node of the directed graph has a corresponding node in one of the acyclic graph and the at least one strongly connected subgraph. A data rate and a data type are determined for each node in the acyclic subgraph using a linear search of the acyclic subgraph. For each strongly connected subgraph, a data rate and a data type are determined for each node in the strongly connected subgraph using a search of the strongly connected subgraph.

It will be appreciated that various other embodiments are set forth in the Detailed Description and Claims which follow.

BRIEF DESCRIPTION OF THE DRAWINGS

Various aspects and advantages of the invention will become apparent upon review of the following detailed description and upon reference to the drawings in which:

FIGS. 3A, 3B, and 3C are diagrams of directed graphs collectively corresponding to a decomposition of the example directed graph of FIG. 2 in accordance with various embodiments of the invention;

DETAILED DESCRIPTION

A designer can design an electronic system at a high level of abstraction using an HLMS. One aspect of designing an electronic system is specifying the data rates and data types received and transmitted by functional blocks on nets interconnecting the functional blocks. The effort by a designer to design an electronic system may be reduced if an HLMS can automatically infer data rates and data types for each net and each input/output port of each functional block from a designer's specification of data rate and data type at a few points in the design.

Existing methods may fail to establish the suitable values for data rates and/or the data types in an electronic system from a designer's specification of data rate and data type at a few points in the design, even though feasible values are possible. When a designer specifies multiple data rates and data types that are incompatible, such that feasible values for data rates and types in an electronic system are impossible, existing methods may fail to provide any indication of the cause for the inability to establish data rates and data types in the electronic system. Typically, existing methods fail to establish data rates and data types in an electronic design due to feedback loops or interrelationships between a data rate and a data type. Generally, existing methods perform a sequential propagation of data rate information from functional block to functional block and a separate sequential propagation of data type information from functional block to functional block.

In contrast, various embodiments of the invention provide approaches for successfully establishing data rate and data type information in an electronic system that contains feedback loops and/or interrelationships between a data rate and a data type. These approaches simultaneously establish data rate and data type information in a single operation, which propagates data rate and data type information together from functional block to functional block using a potentially iterative search of the structure of the electronic system. Further, these approaches may identify incompatible specifications of data rate and data type by a designer when these approaches fail to establish data rates and data types in an electronic design.

Figure 1:
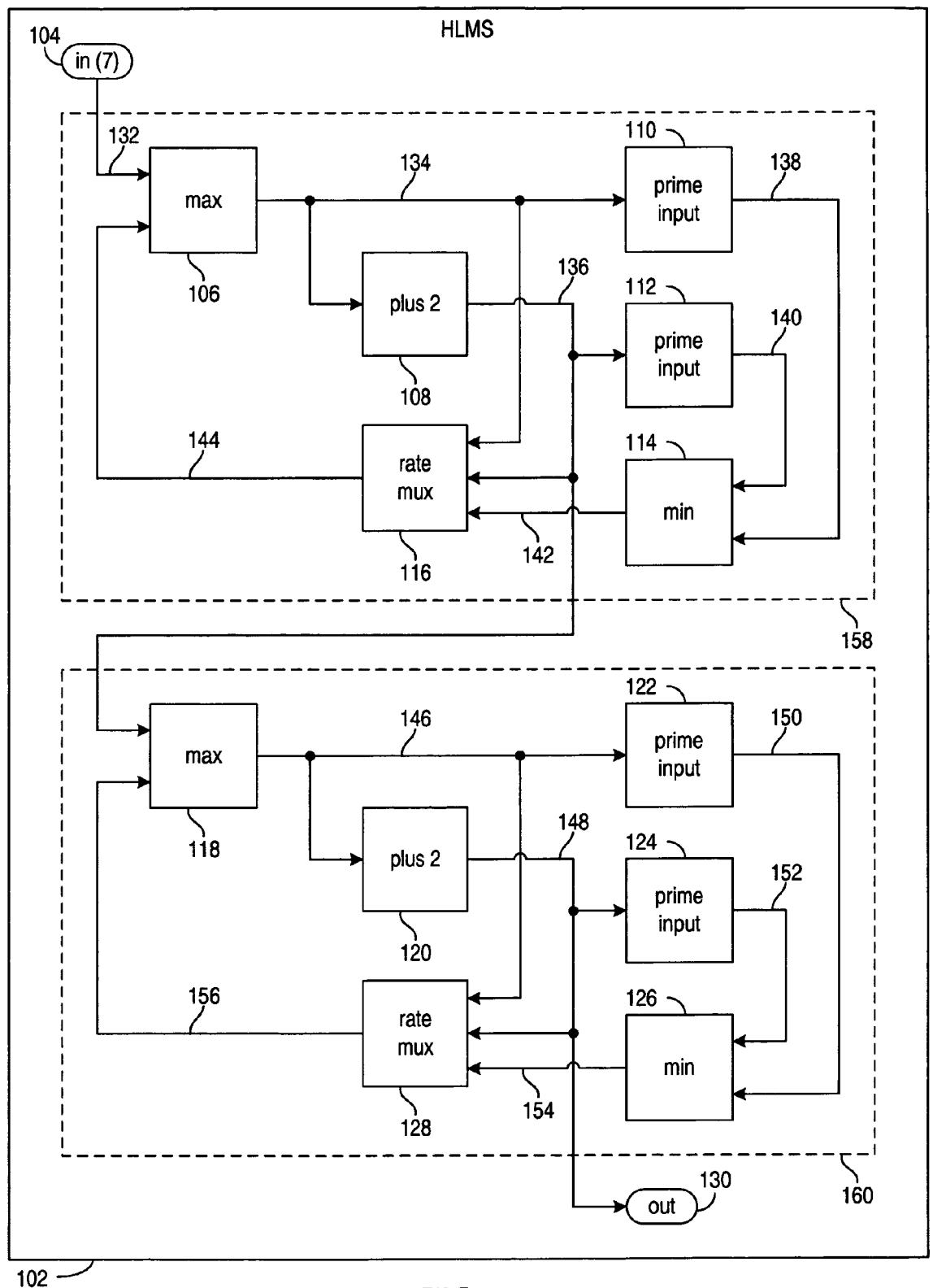
FIG. 1 is an example block diagram in a HLMS illustrating construction of an electronic design in accordance with various embodiments of the invention.

FIG. 1 is an example block diagram in a HLMS 102 illustrating construction of an electronic design in accordance with various embodiments of the invention. Typically, the electronic design is constructed in a memory arrangement of a computing system executing software for the HLMS 102. The block diagram in HLMS 102 may correspond to a view of the electronic design presented on a user interface of the HLMS 102. Such a user interface may permit a designer to "drag-and-drop" each block 104 through 130 from a library of blocks and to interconnect the blocks 104 through 130 with nets 132 through 156 to construct the electronic design.

Generally, each of nets 132 through 156 is driven by a corresponding one of blocks 104 through 130 at an output port of the block. A net may drive an input port of more than one of the blocks. For example, net 134 is driven by an output port of block 106 and drives input ports of blocks 108, 110, and 116. In the example embodiment, there are no tri-state nets connected to multiple outputs of functional blocks.

The electronic design may include an input block 104 for each input to the electronic design and an output block 130 for each output of the electronic design. It will be appreciated that an input block will have an "output" connected to another functional block, and therefore, have an associated output data rate and output data type. In one example, a designer may specify an input data rate of seven units per cycle for the input block 104 and an input data type of an unsigned integer with eight bits for the input block 104. The input data rate and input data type for an input block translate into an equal output data rate and a like output data type. Seven units per cycle may correspond to seven units of the data type per cycle, or seven units of eight bits per cycle. A cycle may correspond to a period of a clock controlling the operation of the electronic design during simulation or during operation of a hardware implementation of the electronic design. It will be appreciated that a designer may specify a data rate and a data type at more than one block of the electronic design.

The label in each of the functional blocks, for example, "max" in block 106, names the propagation function that specifies the output data rate of the corresponding functional block as a function of the input data rate(s). For example, the "max" function indicates that the output data rate of block 106 is the maximum of the input data rates at the two input ports of the block. A propagation function may also specify a constraint on the input. For example, the propagation function "prime input" specifies that the input data rate must be a prime number and provides that the output data rate is one unit per cycle, for example.

The example electronic system shown in HLMS 102 includes feedback. Block 106, net 134, block 116, and net 144 form a feedback loop. Generally, any feedback in an electronic design can be bounded within portions of a design and the blocks within the bounded portion denoted as strongly connected components. The example electronic design has two strongly connected components 158 and 160. A strongly connected component, such as 158 and 160, may include multiple feedback paths; however, feedback paths do not exist between the strongly connected components.

Figure 2:
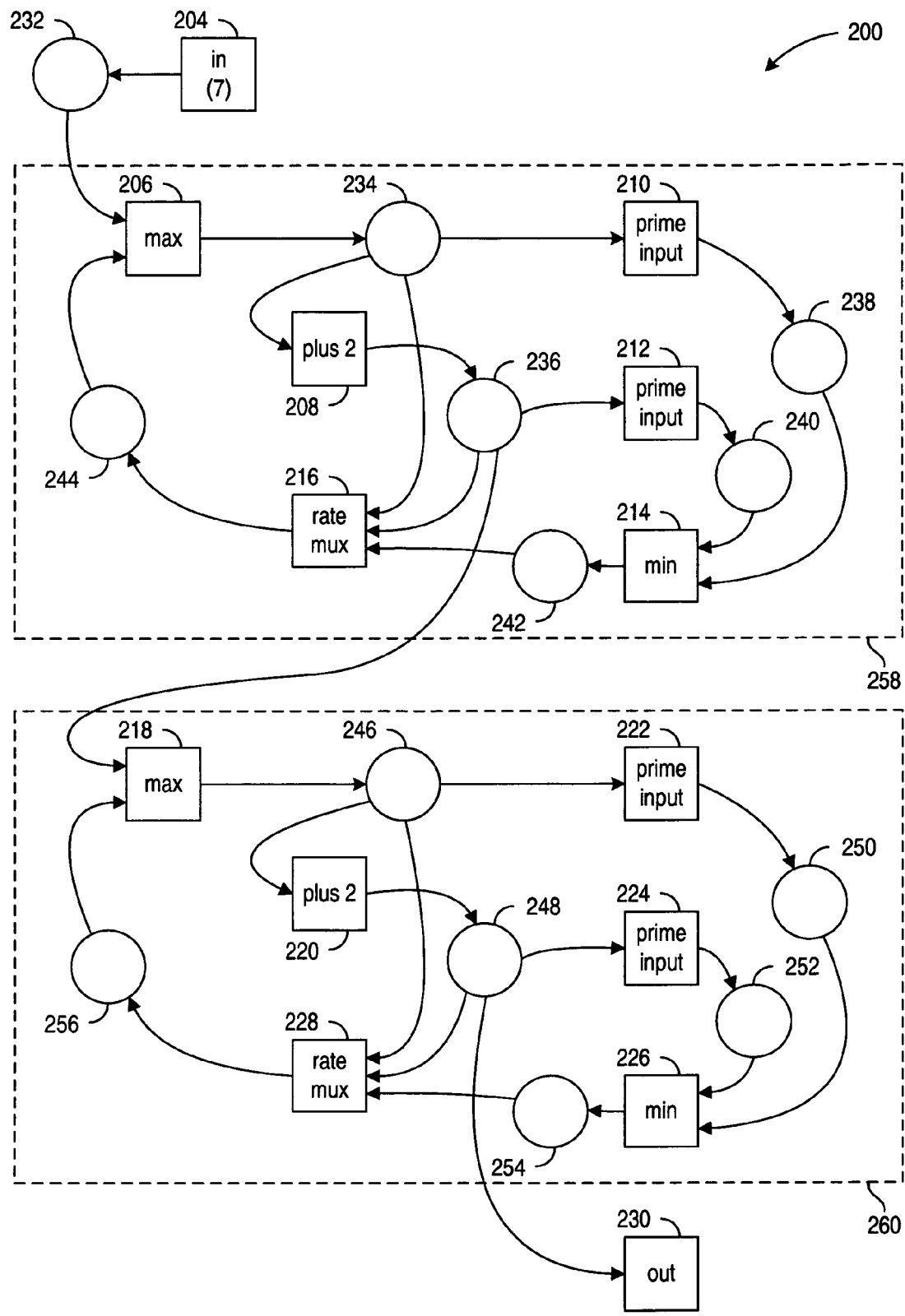
FIG. 2 is a diagram of an example directed graph corresponding to the example electronic design of FIG. 1.

FIG. 2 is a diagram of an example directed graph 200 corresponding to the example electronic design of FIG. 1. Each of functional blocks 104 through 130 of FIG. 1 is represented by a corresponding one of nodes 204 through 230 in FIG. 2, and each of nets 132 through 156 of FIG. 1 is represented by a corresponding one of nodes 232 through 256. The directed graph 200 has edges that correspond to outputs of blocks 104 through 128 of FIG. 1. Each edge is directed from one of nodes 204 through 228, which correspond to one of the blocks 104-128, and the edge is directed to the one of nodes 232 through 256 which corresponds to the net that is connected to the output port of that block. In addition, the directed graph 200 similarly has edges that correspond to input ports of the blocks 106 through 130 of FIG. 1. For ease of reference, nodes corresponding to functional blocks are shown as squares and nodes corresponding to nets are shown as circles.

The directed graph 200 has two strongly connected subgraphs 258 and 260. Various graph search algorithms may be used to determine the strongly connected subgraphs 258 and 260. In one embodiment, a depth first search of directed graph 200 records back edges to nodes already visited during the depth first search. For each back edge directed from a head node to a tail node, a strongly connected subgraph is the intersection between the set of all nodes reachable from the head node and the set of all nodes reachable from the tail node after the edges in the directed graph 200 are reversed.

The strongly connected subgraphs 258 and 260 contain all the cycles in the directed graph 200. Various embodiments of the invention establish data rates and data types in the directed graph 200 using one graph search approach for each strongly connected subgraph 258 and 260 and another approach for the remainder of the directed graph 200.

In one embodiment, a value is associated with each of nodes 204 through 230, and this value identifies the strongly connected subgraph 258 and 260, if any, in which the node is included. For example, a value of zero may be associated with nodes 204 and 230 to indicate these nodes are not included in any strongly connected subgraph, a value of one may be associated with nodes 206 through 216 to indicate these nodes are included in a first strongly connected subgraph 258, and a value of two may be associated with nodes 218 through 228 to indicate these nodes are included in a second strongly connected subgraph 260.

A graph search of directed graph 200 used to establish data rates and data types may begin at inputs nodes 204 using a first graph search process. Upon visiting a node (206-228) that is a member of a strongly connected subgraph 258 or 260, a second graph search process may establish data rates and data types for all nodes within the strongly connected subgraph. This second graph search process may be performed before resuming the first graph search approach for the remainder of the directed graph 200.

FIGS. 3A, 3B, and 3C are diagrams of directed graphs 302, 304, and 306 collectively corresponding to a decomposition of the example directed graph 200 of FIG. 2 in accordance with various embodiments of the invention. The example directed graph 200 of FIG. 2 is decomposed into the acyclic subgraph 302 of FIG. 3A and the strongly connected subgraphs 304 and 306 of FIGS. 3B and 3C, respectively. The labels in nodes 204 though 230 (which are scattered between FIGS. 3A-C) name the propagation function that specifies the output data rate of the corresponding functional block as a function of the input data rate(s). In addition, nodes 308, 310, and 204 through 256 are labeled with a final data rate (in parentheses) established during the graph searches of directed graphs 302, 304, and 306. A specific data type may also be established for the nodes during the graph searches of directed graphs 302, 304, and 306.

The decomposition of directed graph 200 of FIG. 2 determines the strongly connected subgraphs 258 and 260 as previously discussed, and generates the acyclic subgraph 302 of FIG. 3A by representing the strongly connected subgraphs 258 and 260 of directed graph 200 with inclusion nodes 308 and 310. For example, node 204 of FIG. 2 corresponds to node 204 of FIG. 3A, node 232 of FIG. 2 corresponds to node 232 of FIG. 3A, strongly connected subgraph 258 of FIG. 2 corresponds to node 308 of FIG. 3A, strongly connected subgraph 260 of FIG. 2 corresponds to node 310 of FIG. 3A, and node 230 of FIG. 2 corresponds to node 230 of FIG. 3A.

A topological sorting of the nodes 204, 232, 308, 310, and 230 of the acyclic graph 302 may be used to search these nodes in a linear order to propagate data rates and data types together. A topological sorting of the nodes for an acyclic graph 302 creates a topological order of the nodes, such that for each edge of the acyclic graph 302 directed from a first node to a second node, the second node appears in the topological order after the first node. Thus, on visiting a current node in the linear order of the topological order, every other node that has an edge directed to the current node has already been visited. Because the data rate and data type for a current node is generally dependent on the properties of the current node and the data rate and data type for each other node that has an edge directed to the current node, sufficient information is available to determine the data rate and data type for a current node on visiting the node in the topological ordering.

A topological order for acyclic graph 302 is nodes 204, 232, 308, 310, and 230 in that order. During the linear traversal of the topological order and on visiting the inclusion node 308, which corresponds to the strongly connected subgraph 304, a graph search, which may iterate over the subgraph 304, is used to determine the rate and type information for each node in the strongly connected subgraph 304, as discussed below. After completing the iterative graph search of the strongly connected subgraph 304, the linear graph search of the acyclic subgraph 302 may continue. Similarly, on visiting the inclusion node 310 during the linear graph search of the acyclic subgraph 302, an iterative graph search of the strongly connected subgraph 306 may be performed before resuming the linear graph search of the acyclic subgraph 302. It will be appreciated that node 308 is a trivial subgraph and node 310 is a trivial subgraph.

After completing the traversal of the topological order, the data rate and the data type are typically determined for each node 204, 232, 308, 310, and 230 of the acyclic graph 302. However, during the traversal of the topological order, inconsistent data rates and data types may be discovered. For example, a functional block with two inputs may have the requirement that the input data types received at each of the inputs are identical. On visiting the node corresponding to this functional block, any such inconsistent data types can be discovered and a user of the HLMS can be notified of the inconsistency. Such inconsistent data types may correspond to an example of over-constrained specification of data rates and data types by a designer.

In another example, the specification of data rates and data types by a designer may be under-constrained. After completing the linear traversal of the topological order, the data rate and/or the data type may be determined for certain nodes of the acyclic graph 302, and other nodes of the acyclic graph may have an unknown data rate and/or an unknown data type. A user of the HLMS can be notified of the unknown values for the data rate and/or data type for these nodes. Typically, a user can provide additional specifications for data rate and/or a data type in the design to eliminate the unknown values.

An example data rate and date type specification by a designer may specify an input data rate of seven units per cycle for node 204 and an input data type of an unsigned integer with eight bits for the node 204. The linear graph search may propagate this data rate and this data type from node 204 to node 232, such that the data rate for node 232 is seven units per cycle and the data type is an 8-bit unsigned integer. Generally, a node corresponding to a net has an output data rate and an output data type that are identical to the output data rate and output data type of the node corresponding to the functional block to which the net is connected. The data rate from node 232 of seven units per cycle and data type of an 8-bit unsigned integer may be provided as an input to node 308 for the strongly connected subgraph 304.

An iterative graph search of subgraph 304 of FIG. 3B may use repeated breadth first searches that each begin from the known data rates and data types. From the linear search of subgraph 302 of FIG. 3A, the known values may be seven units per cycle and an 8-bit unsigned integer for a first input of node 206. Node 206 may correspond to a functional block that has an output rate that is the maximum of the input rates and an output type that has the maximum size of the input data types.

For a node, such as node 206 that corresponds to a functional block, properties of the functional block should provide a mapping from a specific input data rate and input data type for each input of the functional block to a specific output data rate and output data type for each output of the functional block. For example, the properties may provide one constraint that defines the output data rate as a function of the input data rate and input data type, and another constraint that defines the output data type as a function of the input data rate and input data type. In a specific example, a serial to parallel converter converts a serially input word of width n bits to n single bit parallel outputs. A function for determining the output data rate in this example is output data rate=(1/n)* (input data rate). In another example, a probe maps the input data rate and data type onto a unique identifier that may be represented as a color in a graphical user interface display Optionally, a functional block may provide a mapping to a specific output data rate and output data type for some or all outputs even though the input data rate and input data type are not known for all of the inputs. For a solution to be found by the graph search processes for an electronic design having feedback, some functional blocks should provide a mapping to a specific output data rate and output data type for the outputs when the input data rate and input data type are known for less than all of the inputs.

A tentative output data rate and output data type may be assigned to node 206 using properties of node 206 provided by an associated functional block, even though the input data rate and input data type for the second input is unknown. The tentative output data rate and output data type may match the seven units per cycle and an 8-bit unsigned integer from the known first input. Node 234, which corresponds to a net, has input and output data rates and data types that are the same as the output data rate and output data type of node 206.

Node 208 has an output data rate that is two units per cycle greater than the input data rate (as shown by the propagation function "plus 2") and a data type that matches the input data type. Thus, nodes 208 and 236 may be assigned an output data rate of nine units per cycle and an output data type of an 8-bit unsigned integer.

Node 210 may require that the input data rate (which is tentatively seven as described above) has a prime number of units per cycle (the "prime input" propagation function) and an output data type that matches the input data type for a proper input data rate. For an input data rate that is a prime number of units per cycle, the output data rate of node 210 may be one unit per cycle as specified by the propagation function. Thus, for an input data rate of seven units per cycle, node 210 and node 238 are assigned an output data rate of one unit per cycle and an output data type of an 8-bit unsigned integer. Similarly, node 212 may require that the input data rate be a prime number of units per cycle. Because the input data rate of nine units per cycle is not prime, the improper input data rate for node 212 may be indicated by setting the output data rate of node 212 to zero units per cycle and the output data type from node 212 to zero bits. The values of zero for the output data type and the output data rate may be propagated to node 240 to indicate the improper data rate.

Node 214 may correspond to a functional block that produces an output data rate that is the minimum of the input data rates and an output data type that has the minimum size of the input data rates. Thus, node 214 and node 242 may be assigned an output data rate of zero units per cycle and a data type of zero bits.

Node 216 corresponds to a functional block that is a rate multiplexer having a control input and two data inputs. Depending on the input data rate of the control input, the output data rate and data type may match the input data rate and input data type of one or the other of the data inputs. For a control input data rate of zero units per cycle from node 242, the data rate and data type received from node 236 may be assigned to node 216. Thus, node 216 and node 244 are assigned an output data rate of nine units per cycle and an output data type of an 8-bit unsigned integer.

A feedback loop from node 244 to node 206 gives an input data rate of nine units per cycle and an input data type of an 8-bit unsigned integer to the previously unknown values for the second input of node 206. Recall that the input data rate of the other input of node 206 is seven units per cycle and the other input data type is an 8-bit unsigned integer. Because the previously assigned output data rate of seven units per cycle is not the maximum of the input data rates to node 206, another iteration of the graph search begins with assignment of an output data rate of nine units per cycle and an output data type of an 8-bit unsigned integer to nodes 206 and 234.

Nodes 208 and 236 have an output data rate of eleven units per cycle and an output data type of an 8-bit unsigned integer. Because node 210 does not have an input rate that is prime, nodes 210 and 238 are assigned an output data rate of zero units per cycle and an output data type of zero bits. Because node 212 has an input rate that is prime, nodes 212 and 240 are assigned an output data rate of one unit per cycle and an output data type of an 8-bit unsigned integer. Nodes 214 and 242 again are assigned an output data rate of zero units per cycle and an output data type of zero bits. Because node 216 again selects the output data rate and output data type of node 236, nodes 216 and 244 are assigned an output data rate of eleven units per cycle and an output data type of an 8-bit unsigned integer.

Another iteration of the graph search begins because the current output data rate assigned to node 206 (9 in the previous iteration) is not the maximum of the input data rates of node 206. Nodes 206 and 234 are assigned an output data rate of eleven units per cycle and an output data type of an 8-bit unsigned integer. Nodes 208 and 236 have an output data rate of thirteen units per cycle and an output data type of an 8-bit unsigned integer. Because node 210 has an input rate that is prime, nodes 210 and 238 are assigned an output data rate of one unit per cycle and an output data type of an 8-bit unsigned integer. Because node 212 has an input rate that is prime, nodes 212 and 240 are assigned an output data rate of one unit per cycle and an output data type of an 8-bit unsigned integer. Because the minimum input data rate received by node 214 is one unit per cycle and the minimum size of the input data types is an 8-bit unsigned integer, nodes 214 and 242 are assigned an output data rate of one unit per cycle and an output data type of an 8-bit unsigned integer.

Because node 216 now selects the output data rate and output data type of node 234, nodes 216 and 244 again are assigned an output data rate of eleven units per cycle and an output data type of an 8-bit unsigned integer. Thus, the output data rate and output data type from node 244 are consistent with the previously assigned output data rate and output data type assigned to node 206 of eleven units per cycle and an 8-bit unsigned integer. In one embodiment, the iterative breadth first graph search of strongly connected subgraph 304 completes when an iteration completes without the data rate or the data type changing from the previous iteration for any node.

An iteration limit may be provided for the number of iterations of the breadth first graph search of a strongly connected subgraph 304 and 306. Reaching the iteration limit for the breadth first search of a strongly connected subgraph may indicate that convergence to a consistent set of data rates and data types cannot be realized for the strongly connected subgraph. A user of a HLMS may be notified that the specification of data rates and data types has an inconsistency, such as over-constrained data rates and/or data types, for the strongly connected subgraph.

Under-constrained data rates and/or data types may result in a consistent set of data rates and data type that include an unknown data rate and/or an unknown data type for certain nodes of a strongly connected subgraph 304 and 306. A user of a HLMS may be notified that the specification of data rates and data types is under-constrained.

After completing the iterative search of strongly connected subgraph 304, the linear search of acyclic graph 302 may resume with node 308 given the output data rate and output data type of node 236 of thirteen units per cycle and an 8-bit unsigned integer. The linear search of acyclic graph 302 may continue at node 310 corresponding to strongly connected subgraph 306 of FIG. 3C. An iterative breadth first search of strongly connected subgraph 306 that is similar to the iterative breadth first search of strongly connected subgraph 304 may produce an output data rate of nineteen units per cycle and an output data type of an 8-bit unsigned integer for nodes 310 and 230.

Figure 4:
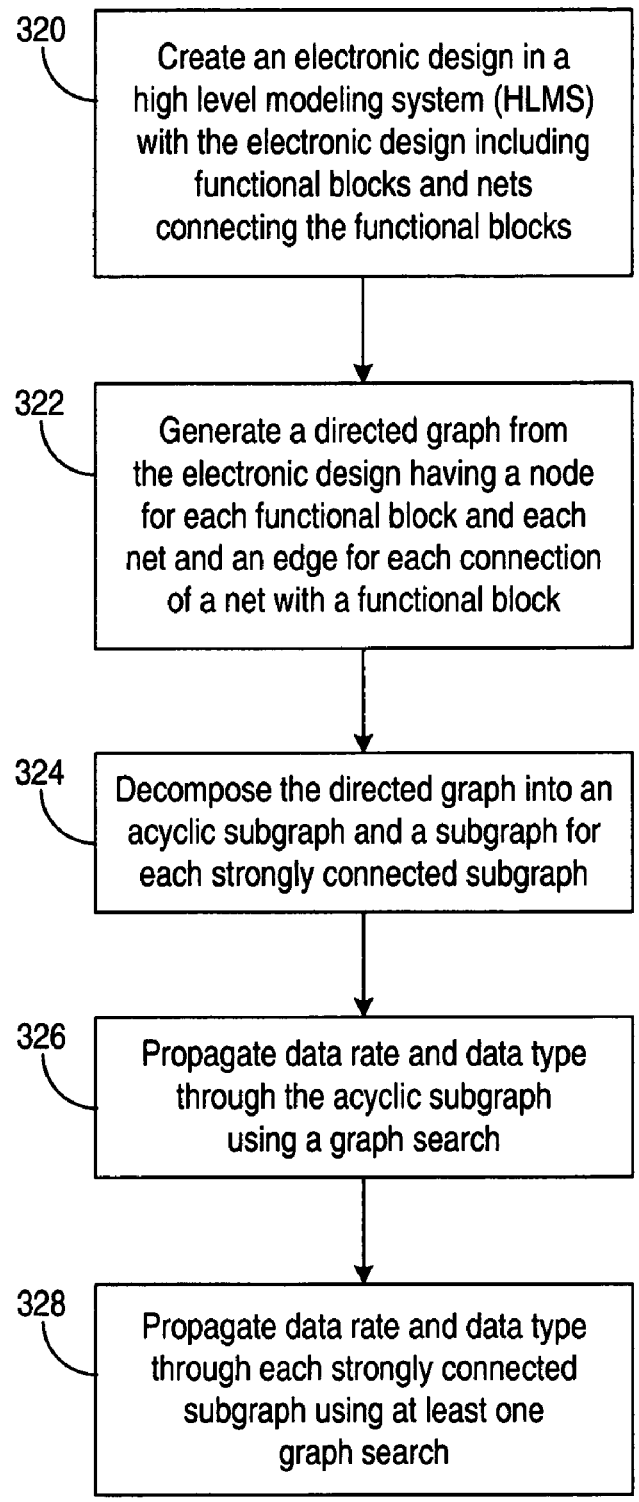
FIG. 4 is a flow diagram of a process for determining data rate and data type information in an HLMS in accordance with various embodiments of the invention.

FIG. 4 is a flow diagram of a process for determining data rate and data type information in an HLMS in accordance with various embodiments of the invention. The determination of data rates and data types may be factored into a determination of data rates and data types for each strongly connected component of electronic design, and using the results for each strongly connected component in a determination of the data rates and data types for the entire electronic design.

At step 320, an electronic design is created in response to user input by a designer to an HLMS. The electronic design includes functional blocks and nets connecting outputs of the functional blocks to inputs of the functional blocks. At step 322, a directed graph is generated from the electronic design in the HLMS. The directed graph includes nodes for the functional blocks and nets. The edges in the directed graph represent connections of nets to the functional blocks. For each output of a functional block, an edge is directed from the functional block and to the net connected to that output. For each input to a functional block, an edge is directed from the net connected to the input of the functional block and to the functional block.

At step 324 the directed graph is decomposed into a subgraph for each strongly connected subgraph and an acyclic subgraph. The acyclic subgraph does not contain any feedback cycles because all feedback cycles are contained within a strongly connected subgraph. At step 326, data rates and data types are propagated through the acyclic subgraph using a graph search that is typically a linear search based on a topological ordering of the nodes of the acyclic subgraph. At step 328, data rates and data types are propagated through the strongly connected subgraphs using at least one graph search. In one embodiment, each strongly connected subgraph is searched by an iterative sequence of breadth first searches.

During the search of the acyclic subgraph and each iteration of a search of each strongly connected subgraph, data rates and data types are propagated together. The data rate for a current node in one of the graph searches is a function of properties of the current node and the data rate and data type of each node that has an edge directed to the current node. Similarly, the data type for a current node in one of the graph searches is a function of properties of the current node and the data rate and data type of each node that has an edge directed to the current node. The data rate and data type for a current node that corresponds to a functional block may be determined from the data rate and data type of the inputs of the functional block by the model of the functional block in the HLMS.

Figure 5:
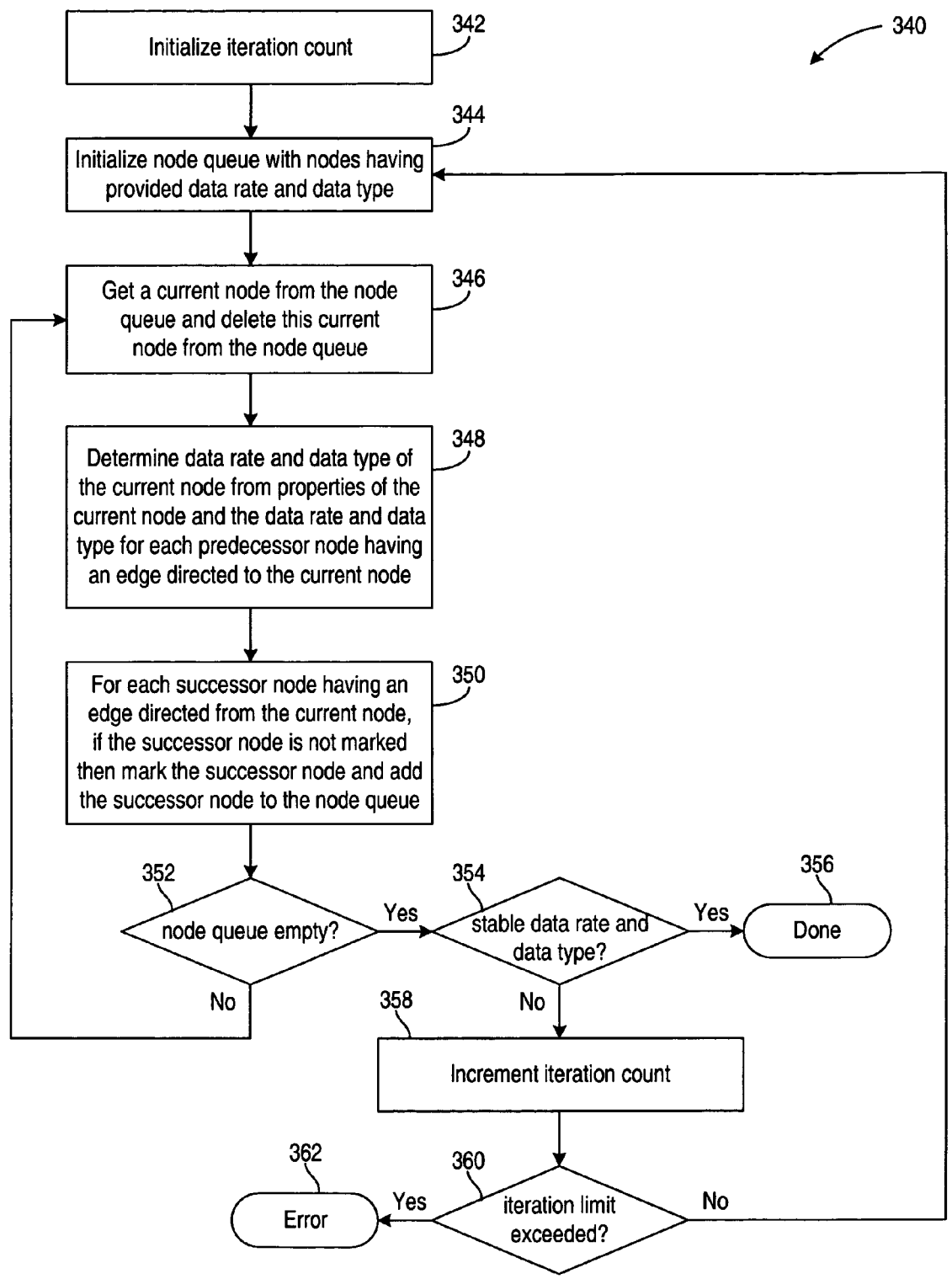
FIG. 5 is a flow diagram of a process for determining data rate and data type information for an electronic design using iterative graph searches of a strongly connected subgraph in accordance with various embodiments of the invention.

FIG. 5 is a flow diagram of a process 340 for determining data rate and data type information for an electronic design using iterative graph searches of a strongly connected subgraph in accordance with various embodiments of the invention. Each iteration of the graph search may be a breadth first graph search.

At step 342 a counter of the number of iterations is initialized. The value of the counter may be used to detect a potential lack of convergence of the iterative graph searches of the strongly connected subgraph. At step 344, the nodes with already known data rates and data types are added to a queue of nodes. Typically, the nodes having already known data rates and data types are nodes with data rates and data types specified by a designer or nodes with data rates and data types determined during the search of the acyclic graph for the electronic design. Any other nodes may have an unknown data rate and an unknown data type.

At step 346 a current node is obtained from the node queue. At step 348 the output data rate and output data type for the current node are determined. Properties of the current node, along with the output data rate and output data type of each node having an edge directed to the current node are used to determine the output data rate for the current node and the output data type for the current node. Generally, properties of a node should indicate a specific output data rate and a specific output data type when the output data rate and output data type are known for each predecessor node having an edge directed to that node. An error may be indicated for a node when that node does not possess properties that allow determination of a specific output data rate and a specific output data type when the output data rate and output data type are known for every predecessor node.

Certain factors, such as feedback within the strongly connected component, may cause the output data rate and output data type to be unknown for certain predecessor nodes. A tentative input data rate and input data type may be assigned to the current node when the output data rate and output data type are unknown for certain predecessor nodes. Typically, the feedback within a strongly connected component will requires assignment of a tentative data rates and/or data types even though the data rate and data type is unknown for certain predecessor nodes. Alternatively, a node may be assigned an unknown data rate and data type due to an unknown data rate and data type for a predecessor node. Iteration of the breadth first search may be necessary after discovery that a previously assigned data rate and/or data type is inappropriate.

At step 350, the breadth first search is continued by adding successor nodes of the current node to the node queue. For each edge directed from the current node to a successor node, the successor node is added to the node queue if the successor node has not already been added to the node queue. A node may be marked when the node is added to the node queue, and each successor node of the current node is added to the node queue if the successor node is not already marked.

Decision 352 checks whether the node queue is empty. When the node queue is not empty process 340 loops to step 346 and otherwise process 340 proceeds to decision 354. Decision 354 checks whether stable data rates and data types are determined. In one embodiment, if the data rate for each node is the same as the previous check of decision 354 and the data type for each node is also the same as the previous check of decision 354, then process 340 completes at step 356 with stable data rates and data types. Otherwise, process 340 proceeds to step 358.

At step 358, the iteration count is incremented. Decision 360 checks whether the iteration limit is exceeded. Process 300 proceeds from decision 360 to error indication step 362 when the iteration limit is exceeded. When additional iterations are possible, process 300 iterates to step 344, and typically at step 344 the node queue has the same initialization as the previous iteration. After completing the iterations at step 356, an additional check may be made for any unknown data rates or data types.

Those skilled in the art will appreciate that various alternative computing arrangements, including one or more processors and a memory arrangement configured with program code, would be suitable for hosting the processes and data structures of the different embodiments of the present invention. In addition, the processes may be provided via a variety of computer-readable media or delivery channels such as magnetic or optical disks or tapes, electronic storage devices, or as application services over a network.

The present invention is thought to be applicable to a variety of systems for determining data rates and data types of design blocks in a high-level modeling system. Other aspects and embodiments of the present invention will be apparent to those skilled in the art from consideration of the specification and practice of the invention disclosed herein. It is intended that the specification and illustrated embodiments be considered as examples only, with a true scope and spirit of the invention being indicated by the following claims.

What is claimed is:

1. A processor-based method for determining data rates and data types at inputs and outputs of a plurality of functional blocks that are connected by a plurality of nets in an electronic design, wherein at least one of the functional blocks has a user-specified output data rate and output data type, comprising:

generating in a computing system a directed graph of nodes and edges from the electronic design, wherein the directed graph has a node for each functional block, a node for each net, and an edge for each connection of a net with a functional block;

decomposing the directed graph into an acyclic subgraph and at least one strongly connected subgraph, wherein the acyclic subgraph includes a corresponding subgraph for each strongly connected subgraph and each node of the directed graph has a corresponding node in one of the acyclic graph and the at least one strongly connected subgraph;

assigning to an input data rate and an input data type of each node corresponding to each functional block coupled via a net to an output of the at least one functional block, the output data rate and output data type of the at least one functional block, respectively; and for each functional block, determining an output data rate and output data type from the input data rate and the input data type of the functional block;

wherein determining the output data rate and the output data type of data output from the functional block includes:

determining a data rate and a data type for each node in the acyclic subgraph using a search of the acyclic subgraph, and for each strongly connected subgraph, determining an output data rate and an output data type for each node in the strongly connected subgraph using at least one search of the strongly connected subgraph; and assigning, by the computing system, the output data rates and output data types to the plurality of functional blocks.

2. The method of claim 1, wherein each of the nets of the electronic design connects one output port of a functional block to at least one input port of at least one functional block.

3. The method of claim 2, wherein the edges of the directed graph include for each functional block an edge directed from a node for the functional block to a node for a net connected to the output port of the functional block and an edge for each input port of each functional block directed from a node for the net connected to the input port of the functional block to a node for the functional block.

4. The method of claim 1, wherein each search of each subgraph visits nodes of the subgraph using traversal of edges of the subgraph.

5. The method of claim 4, wherein for the traversal from a first node to a second node for each search, in response to the second node corresponding to a net the output data rate and the output data type of the second node is the output data rate and the output data type of the first node, and in response to the second node corresponding to a functional block the output data rate and the output data type of the second node are determined as a function of the output data rate and the output data type of the first node and a propagation function of the second node.

6. The method of claim 5, wherein the propagation function includes a constraint on the output data rate of the second node as a function of the data rate and the data type of the first node.

7. The method of claim 5, wherein the propagation function includes a constraint on the data type of the second node as a function of the data rate and the data type of the first node.

8. The method of claim 1, wherein the corresponding subgraph for each strongly connected subgraph in the acyclic graph is a node of the acyclic graph.

9. The method of claim 8, wherein the at least one search of the strongly connected subgraph is performed on visiting the node of the acyclic graph corresponding to the strongly connected subgraph during the search of the acyclic subgraph.

10. The method of claim 1, wherein the search of the acyclic subgraph includes visiting the nodes of the acyclic subgraph in a topological order.

11. The method of claim 1, wherein each of the at least one search of each strongly connected subgraph includes traversing the strongly connected subgraph breadth first.

12. The method of claim 11, wherein each breadth first traversal begins at a node in the strongly connected subgraph that specifies at least one of a data rate and a data type.

13. The method of claim 1, wherein the at least one search of the strongly connected subgraph includes performing a plurality of searches of the strongly connected subgraph.

14. The method of claim 13, further comprising limiting the plurality of searches of the strongly connected subgraph to a selected number.

15. The method of claim 13, wherein the plurality of searches is completed in response to an output data rate and an output data type for each node of the strongly connected subgraph being unchanged from the corresponding output data rate and output data from an immediately previous searches of the strongly connected subgraph.

16. A processor-based method for determining data rates and data types for an electronic design, comprising:

generating in a computing system a directed graph of nodes and edges from the electronic design;

decomposing the directed graph into an acyclic subgraph and at least one strongly connected subgraph, wherein the acyclic subgraph includes a corresponding subgraph for each strongly connected subgraph and each node of the directed graph has a corresponding node in one of the acyclic graph and the at least one strongly connected subgraph;

determining a data rate and a data type for each node in the acyclic subgraph using a linear search of the acyclic subgraph;

for each strongly connected subgraph, determining a data rate and a data type for each node in the strongly connected subgraph using a search of the strongly connected subgraph; and assigning, by the computing system, the determined data rates and data types to the nodes in the computing system.

17. The method of claim 16, further comprising repeating the search of the strongly connected subgraph until the data rates and the data types are the same as an immediately previous search of the strongly connected subgraph.

* * * * *